United States Patent
Hopper et al.

(10) Patent No.: US 7,301,436 B1
(45) Date of Patent: Nov. 27, 2007

(54) APPARATUS AND METHOD FOR PRECISION TRIMMING OF INTEGRATED CIRCUITS USING ANTI-FUSE BOND PADS

(75) Inventors: Peter J. Hopper, San Jose, CA (US); Peter Johnson, Sunnyvale, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 178 days.

(21) Appl. No.: 11/274,491

(22) Filed: Nov. 14, 2005

(51) Int. Cl.
*H01C 13/00* (2006.01)

(52) U.S. Cl. ...................................... 338/220; 338/195

(58) Field of Classification Search ................ 338/195, 338/220, 307, 327
See application file for complete search history.

(56) References Cited

U.S. PATENT DOCUMENTS

| | | | | |
|---|---|---|---|---|
| 5,235,205 A | * | 8/1993 | Lippitt, III | ................... 257/528 |
| 5,394,019 A | * | 2/1995 | Audy | .......................... 327/525 |
| 5,422,298 A | * | 6/1995 | Jimenez | ....................... 438/382 |
| 5,682,049 A | * | 10/1997 | Nguyen | ....................... 257/363 |
| 5,710,538 A | * | 1/1998 | Zinn et al. | ................... 338/195 |
| 6,529,116 B2 | * | 3/2003 | Van Den Broek et al. | .. 338/309 |

* cited by examiner

*Primary Examiner*—K. Richard Lee
(74) *Attorney, Agent, or Firm*—Beyer Weaver LLP

(57) ABSTRACT

An apparatus and method for using anti-fuse bond pads used to provide trimmed resistor values to the input terminals of circuits on an integrated circuit die. The apparatus and method comprises fabricating on a semiconductor integrated circuit a resistive network. The resistive network includes a first terminal, a second terminal and a resistor coupled between the two terminals. An anti-fuse bond pad and a trimming resistor are coupled between the first terminal and the second terminal. The trimming resistor is configured to be electrically coupled between the first terminal and the second terminal when a ball bond is formed on the anti-fuse bond pad. In various embodiments, a plurality of the anti-fuse bond pads and trimming resistors may be coupled between the two terminals. By selectively forming ball bonds on the plurality of anti-fuse bond pads, the resistance of the network can be selectively trimmed as needed.

18 Claims, 3 Drawing Sheets

APPARATUS AND METHOD FOR PRECISION TRIMMING OF INTEGRATED CIRCUITS USING ANTI-FUSE BOND PADS

BACKGROUND

1. Field of the Invention

The present invention relates to semiconductor integrated circuits, and more particularly, to an apparatus and method for using anti-fuse bond pads used to provide trimmed resistor values to the input terminals of circuits on an integrated circuit die.

2. Background of the Invention

Computer Automated Design (CAD) tools are now commonly used in the design of both analog and digital integrated circuits. CAD tools allow a designer to develop a circuit design using the software. Once the design has been developed, the software allows the design to be modeled and simulated. With digital circuitry, the software modeling and simulation is relatively simple. In the digital domain, transistors operate as switches. Since the on/off switching characteristics of transistors is straightforward to predict, the modeling and simulation of digital circuitry is highly predictable and accurate. With analog circuitry, however, the transistors operate in the linear range. As a result, the behavior of the transistors is far more difficult to predict due to a host of variables, such as variations in process technology, the differences in the gain of the transistors, and noise for example. It is therefore difficult to model and simulate analog circuitry with a high degree of accuracy.

As a consequence, analog designers operate within certain acceptable variances. These variances are commonly known in the semiconductor industry as "device corner distribution models". Modern CAD tools used for analog typically use these distribution models. If the CAD software for a particular design shows that the circuitry is operating outside of an acceptable device corner (i.e., a distribution model), then either: (i) the circuit needs to be redesigned, (ii) process parameters need to be altered; or (iii) or a combination of both need to be performed to bring the circuit operation within the requisite operational parameters.

The industry trend requires higher levels of precision with analog circuitry. As a consequence, considerable focus is now being placed in the area of more accurate modeling in the semiconductor industry. With more accurate modeling, improved performance metrics and tighter integrated circuit performance can be achieved. Trimming is one technique that is used to achieve tighter specifications.

Trimming is a technique that is commonly used, particularly with analog circuitry, to bring a device that operates outside of specification back within specification. For example, a resistive network may be connected to a differential amplifier. The resistor network ideally includes two resistors of equal value connected to each input of the amplifier respectively. Due process and other variations, however, the value of the two resistors may not be the same (i.e., the circuit may be out of specification). Consequently, one or more trimming resistors may be provided in a resistive network with the two input resistors respectively. By selectively trimming the resistors in each network, the effective resistive value provided to the two inputs of the amplifier can be selectively made equal.

There are a number of well known trimming techniques commonly practiced in the semiconductor industry. With laser trimming for example, a thin metal film may be provided as part of a resistive network. By either selectively removing a portion or all of the thin metal film, the resistance of the resistive network can be altered. In another trimming method, a resistive network including one or more metal film or poly-silicon fuses is provided on the semiconductor chip surface. Again, by selectively blowing one or more of the fuses, the resistance of the network can be controlled. In different variations, the fuses can be either blown by ablation using a laser or by applying a high voltage. In another trimming technique, a transistor can be used to trim a resistor. The resistor, typically made of poly-silicon, is coupled between the transistor and ground. By rapidly turning the transistor on and off, current is driven through the poly-silicon resistor. The current can be used to either trim or blow the resistor. In yet another trimming example, anti-fuses can be used. For example, a resistive network of anti-fuses can be fabricated on the integrated circuit, where each of the anti-fuses is a transistor. By selectively applying a large voltage to the transistors of the resistive network, the gates can be selectively blown, causing the gate oxides to breakdown. As a result, the source and drain of each blown transistor are in electrical connection with one another. In this manner, the resistively of the network can be selectively trimmed.

There are a number of problems associated with current trimming techniques. The formation of poly fuses, thin film resistors, transistors and the like using to make fuses for trimming can represent a significant percentage of the overall surface area on a die. This overhead tends to make the die larger than it would otherwise need to be, decreasing yields. The characteristics of the above listed trimming elements also need to be incorporated in to the CAD software, making circuit performance modeling difficult to predict. Lastly, the aforementioned trimming procedures are highly labor intensive. Typically the chip has to be probed to determine resistor values. Then if necessary, the chips have to be individually trimmed using one of the aforementioned procedures.

An apparatus and method for using anti-fuse bond pads used to provide trimmed resistor values to the input terminals of circuits on an integrated circuit die is therefore needed.

SUMMARY OF THE INVENTION

An apparatus and method for using anti-fuse bond pads used to provide trimmed resistor values to the input terminals of circuits on an integrated circuit die is disclosed. The apparatus and method comprises fabricating on a semiconductor integrated circuit a resistive network. The resistive network comprises a first terminal, a second terminal and a resistor coupled between the two terminals. An anti-fuse bond pad and a trimming resistor are also coupled between the first terminal and the second terminal. The trimming resistor is configured to be electrically coupled between the first terminal and the second terminal when a ball bond is formed on the anti-fuse bond pad. In various embodiments, a plurality of the anti-fuse bond pads and trimming resistors may be coupled between the two terminals. By selectively forming ball bonds on the plurality of anti-fuse bond pads, the resistance of the network can be selectively trimmed as needed.

BRIEF DESCRIPTION OF THE DRAWINGS

Like elements are designated by like reference numbers in the Figures.

DETAILED DESCRIPTION OF THE PREFERRED EMBODIMENTS

Figure 1:
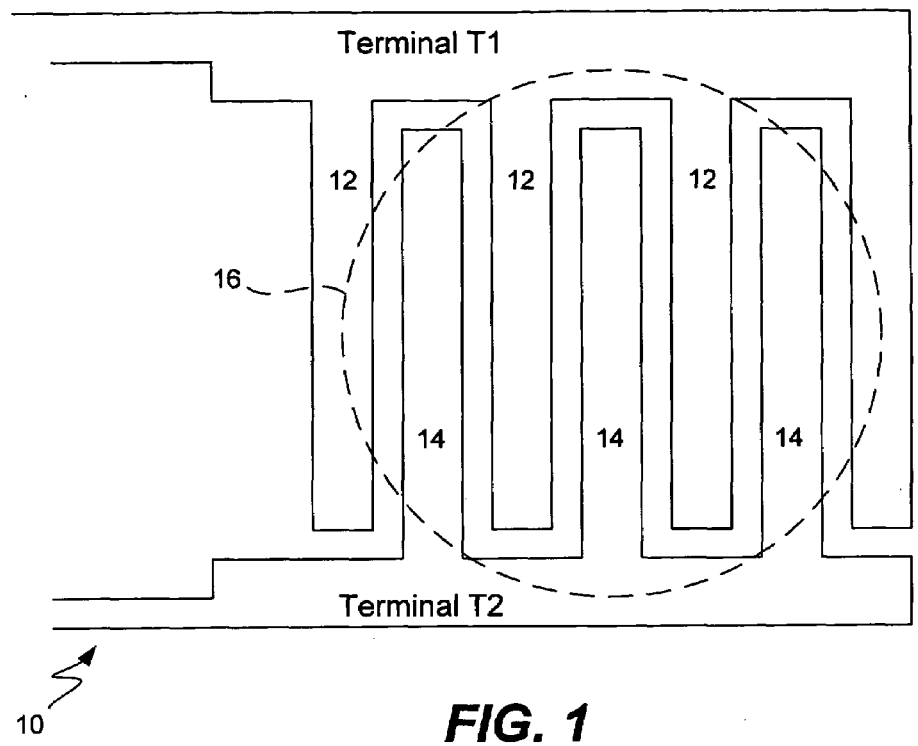
FIG. 1 is a top view of a bond pad used to provide trimmed resistor values according to the present invention.

Referring to FIG. 1, a top view of a bond pad used to provide trimmed resistor values according to the present invention is shown. The bond pad 10 includes two terminals designated T1 and T2. Terminal T1 includes a plurality of fingers 12. Terminal T2 includes a second plurality of fingers 14. As is evident in the figure, the fingers 12 and 14 of terminals T1 and T2 are interleaved with one another. During packaging, as is well known in the art, a ball bond 16 is formed on the bond pad 10. So as to not obstruct the view of the interleaved fingers 12 and 14, the ball bond is illustrated as a dashed circular ball formed over the fingers of the two terminals. When the ball bond 16 is formed on the bond pad 10, the fingers 12 and 14 are shorted (i.e., are in electrical contact with one another). In various embodiments, the fingers 12 and 14 of terminals T1 and T2 are formed using a standard semiconductor metal, such as aluminum or copper.

Figure 2:
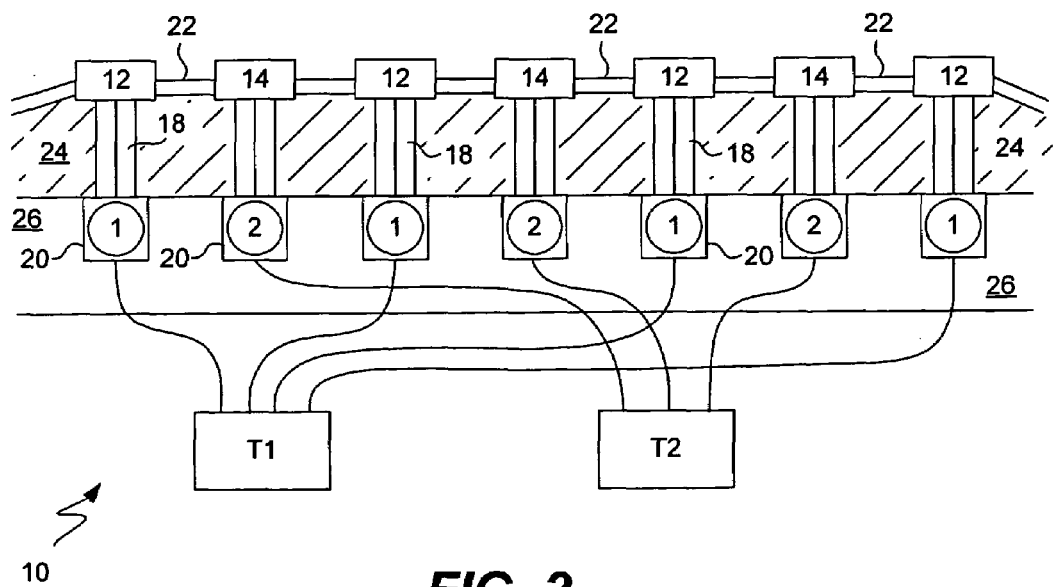
FIG. 2 is a cross section view of the bond pad used to provide trimmed resistor values according to the present invention.

Referring to FIG. 2, a cross section view of the bond pad 10 used to provide trimmed resistor values according to the present invention is shown. The cross section of the bond pad 10 includes the interleaved fingers 12 and 14. Metal vias 18 are provided between each finger 12 and 14 and underlying metallization contacts 20 respectively. The contacts 20, coupled to the fingers 12, are electrically coupled together to form the terminal T1. The contacts 20, coupled to the fingers 14 are electrically coupled to form terminal T2. The contacts 20 are designated as either "1" and "2" to indicate if they are coupled to terminal T1 or terminal T2. A non-conductive passivation layer 22 is provided between the fingers 12, 14 on the top surface of the bond pad 10. The vias 18 are formed through a first non-conductive oxide layer 24. The contacts 20 are formed in an underlying second non-conductive oxide layer 26.

It should be noted that the structure forming the bond pad 10 is fabricated using standard semiconductor fabrication techniques. The fingers 12 and 14 are formed and patterned during the top most metallization layer on the chip. Similarly, the contacts 20 are patterned and formed a during an underlying metallization layer. The passivation layer 22 is a standard protective layer 22 such as silicon oxide or silicon nitride. The oxide layers 24, 26 are formed using standard semiconductor fabrication techniques, such as chemical vapor deposition.

Figure 3:
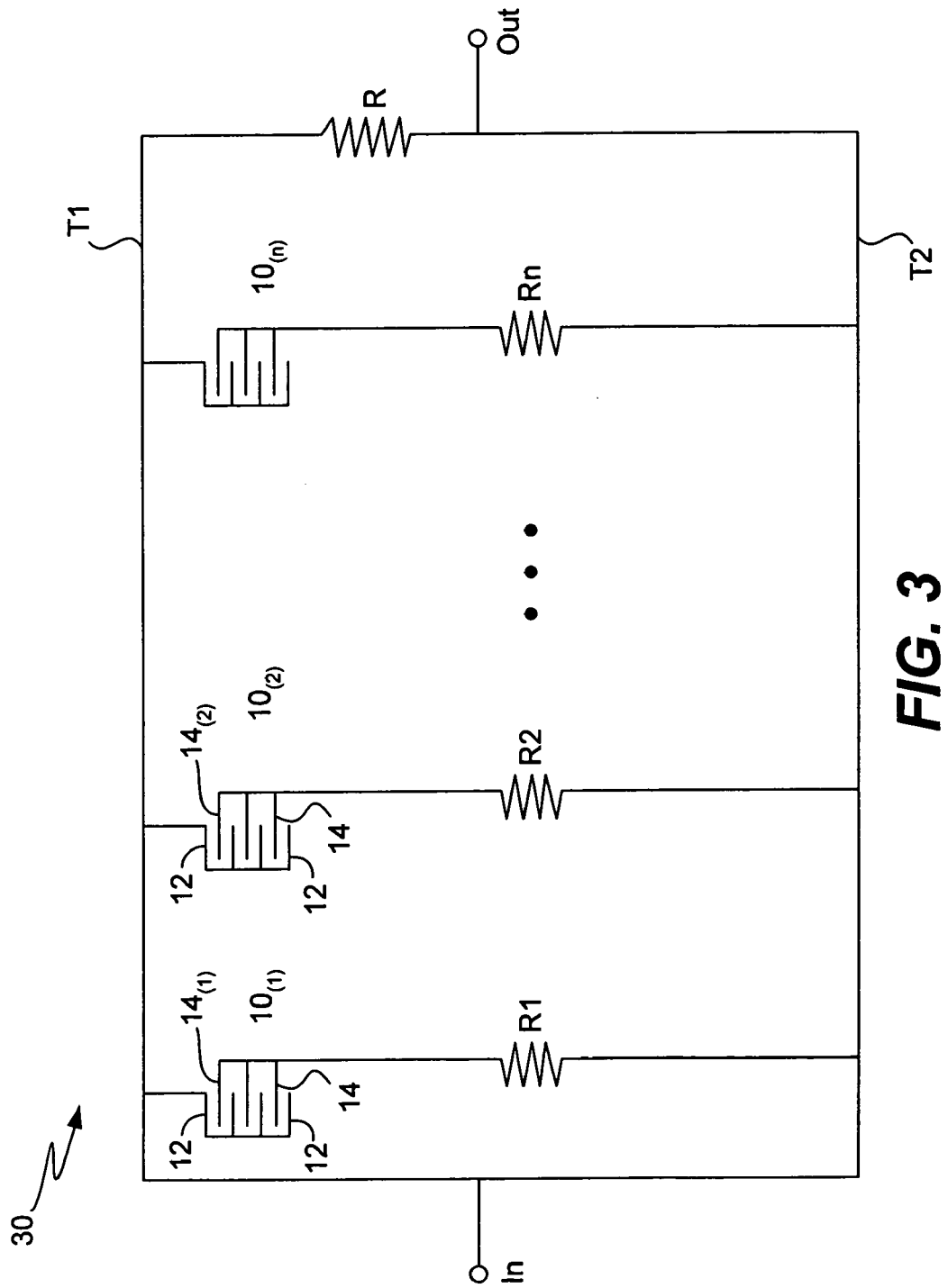
FIG. 3 is a trimming resistor network using the bond pads of the present invention.

Referring to FIG. 3, a trimming resistor network using the bond pads 10 according to the present invention is shown. The resistive network 30 includes a plurality of trimming resistors $R_1$ through $R_n$ and bond pads $10_1$ through $10_n$ coupled in series between the two terminals T1 and T2 respectively. In addition, a resistor R is also provided in series with the other resistors trimming $R_1$ through $R_n$ of the network 30. Resistor R is directly coupled between terminals T1 and T2 and does not have a corresponding bond pad 10. Thus by selectively trimming the resistors $R_1$ through $R_n$ of the network 30 in the manner described below, the value of resistor R can be selectively trimmed.

As evident in the figure, the interleaved fingers 12, 14 of each bond pad 10 form an anti-fuse open circuit (i.e., are not in electrical contact with one another). When a ball bond 16 is formed on a bond pad $10_n$, the fingers 12, 14 are shorted. As a result, the corresponding resistor $R_n$ is electrically coupled in parallel with resistor R between the two terminals T1 and T2. Without a ball bond 16, the resistor the terminals 12, 14 remain open, and the corresponding trimming resistor $R_n$ is not electrically connected to the resistive network 30. Thus, by selectively forming ball bonds 16 on the bond pads $10_1$ through $10_n$, the corresponding resistors $R_1$ through $R_n$ can be electrically coupled to the resistive network 30 respectively. In various embodiments, the values of the resistors $R_1$ through $R_n$ may be either all the same value or different. By making the resistor values of resistors $R_1$ through $R_n$ different, a more precise level of trim-ability may be achieved. For example, if $R_1$ is 0.25 ohms, $R_2$ is 0.5 ohms, $R_3$ is 1.0 ohms, etc. then the resistive network 30 can be trimmed to an accuracy of 0.25 ohms. It should be noted that the above resistive values are only exemplary, and in no way be construed as limiting the invention. It should be well understood by those skilled in the art that any resistive values may be used.

The number of resistor/bond pad "rungs" in the resistive network 30, and the value of the individual resistors R, may also vary, depending on the application. In general, however, the total resistive value of the network 30 can be computed from the following equation:

$$1/R_{total} = 1/R + 1/R_1 + 1/R_2 + \ldots 1/R_n$$

where $1/R_1 + 1/R_2 + \ldots 1/R_n$ only includes the resistive values in the network 30 that are electrically connected between terminals T1 and T2 with a ball bond 16. If a resistor is not electrically coupled between T1 and T2 using a ball bond 16, then that resistor value should not be included in the above calculation.

Figure 4:
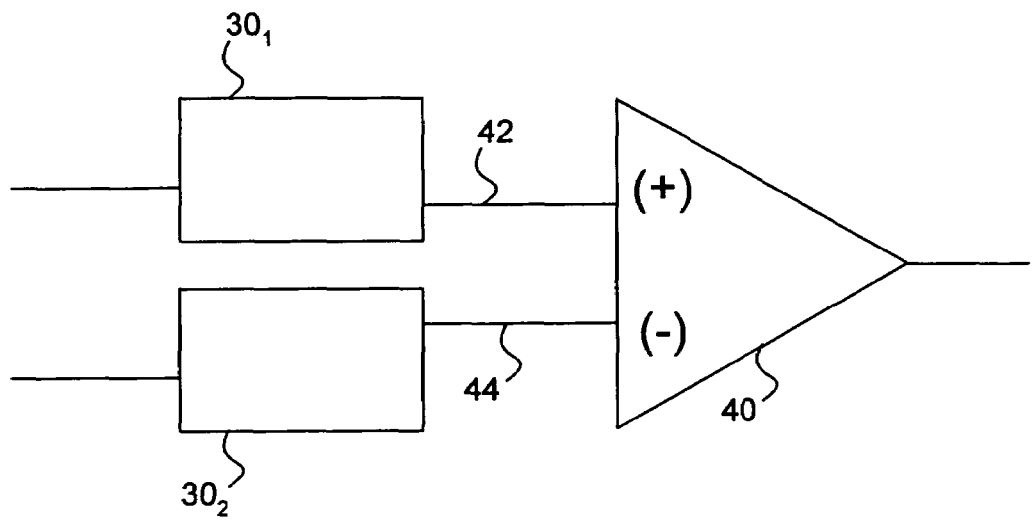
FIG. 4 is an exemplary differential amplifier using two trimming resistor networks accordance to the present invention.

Referring to FIG. 4, a differential amplifier using two trimming resistor networks accordance to the present invention is shown. The differential amplifier 40 includes positive (+) and a negative (−) inputs 42 and 44 respectively. With differential amplifiers, the resistor values R provided at each input 42, 44 should ideally be of equal resistance. Thus, in accordance with the present invention, a resistive network $30_1$ and $30_2$ (as illustrated in FIG. 3) is coupled to inputs 42, 44 respectively. By selectively forming ball bonds 16 in each network $30_1$ and $30_2$ in the manner described above, the resistive value of the networks $30_1$ and $30_2$ can be trimmed so that the respective resistive values of R are effectively the same or within an acceptable tolerance level. Again, it should be noted, that the application shown in FIG. 4 is merely exemplary. The trimming resistive network 30 using the bond pads 10 can be used in any application on a semiconductor device where a high degree of precision is desired. The present invention should therefore in no way be limited to the application shown.

Figure 5:
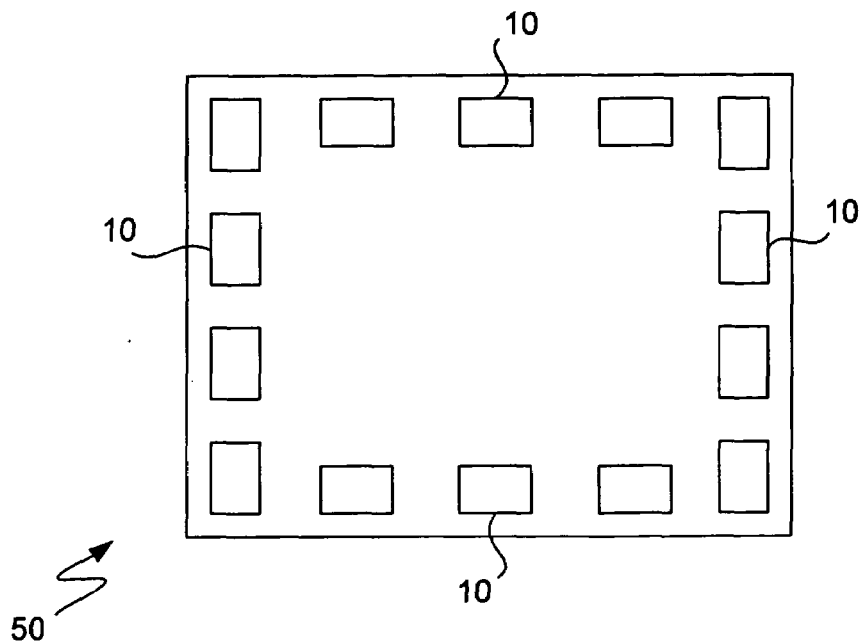
FIG. 5 is a diagram of a semiconductor chip having a plurality of the bond pads used for trimming resistor values according to the present invention.

Referring to FIG. 5, a diagram of a semiconductor chip having a plurality of the bond pads 10 used for trimming resistor values is shown. As is standard on most semiconductor die, the bond pads 10 are provided around the periphery of the device. This arrangement, however, should in no way be construed as limiting. According to various embodiments, the number of the bond pads 10 can vary and they can be located almost anywhere on the device. Similarly, the ball bonds 16 can be selectively placed on the bond pads using a conventional ball bonding machine commonly used in the packaging of semiconductor devices.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An apparatus, comprising
a semiconductor integrated circuit;
a resistive network formed on the semiconductor integrated circuit, the resistive network comprising:
    a first terminal;
    a second terminal;
    a resistor coupled between the first terminal and the second terminal;
    an anti-fuse bond pad coupled between the first terminal and the second terminal; and
    a trimming resister coupled in series with the anti-fuse bond pad between the first terminal and the second terminal, the trimming resistor being configured to be electrically coupled between the first terminal and the second terminal when a ball bond is formed on the anti-fuse bond pad.

2. The apparatus of claim 1, the bond pad further comprises a first set of one or more conductors and a second set of one or more conductors, the one or more conductors of the first set and the second set are arranged in an interleaved pattern on the semiconductor integrated circuit respectively.

3. The apparatus of claim 2, wherein each of the interleaved metal fingers comprises:
    a first patterned metallization layer;
    a underlying second patterned metallization layer; and
    a via electrically coupling the first metallization layer and the underlying second metallization layer.

4. The apparatus of claim 3, further comprising an oxide layer formed between the patterned first metallization layer and the underlying second metallization layer.

5. The apparatus of claim 1, wherein the resistor and the trimming resistor are coupled in parallel with respect to one another between the first terminal and the second terminal.

6. The apparatus of claim 1, wherein the resistive network further comprises a plurality of the anti-fuse bond pads coupled in parallel with respect to one another and the resister between the first terminal and the second terminal.

7. The apparatus of claim 6, wherein the resistive network further comprises a plurality of trimming resistors coupled in series with the plurality of bond pads between the first terminal and the second terminal respectively.

8. The apparatus of claim 7, wherein each of the anti-fuse bond pads comprises a plurality of interleaved metal fingers that are shorted together when the ball bond is formed on the anti-fuse bond pad.

9. The apparatus of claim 7, wherein the plurality of trimming resistors are the same resistive value.

10. The apparatus of claim 7, wherein the plurality of trimming resistors are of different resistive values.

11. A method of fabricating a semiconductor integrated circuit, comprising:
    fabricating a first terminal on the integrated circuit;
    fabricating a second terminal the integrated circuit;
    fabricating a resistor between the first terminal and the second terminal;
    fabricating an anti-fuse bond pad between the first terminal and the second terminal and in parallel with the resistor; and
    fabricating a trimming resistor in series with the anti-fuse bond pad between the first terminal and the second terminal.

12. The method of claim 11, further comprising selectively electrically coupling the trimming resistor in parallel with the resistor between the first terminal and the second terminal by forming a ball bond on the anti-fuse bond pad.

13. The method of claim 11, wherein forming the ball bond further comprises forming a first set of one or more conductors and forming a second set of one or more conductors, the one or more conductors of the first set and the second set are arranged in an interleaved pattern on the semiconductor integrated circuit and coupled to the first terminal and the second terminal respectively.

14. The method of claim 11, wherein the resistor and the trimming resistor are fabricated in parallel with respect to one another between the first terminal and the second terminal, the resistor and the trimming resistor forming a resistive network between the first terminal and the second terminal.

15. The method of claim 11, further comprising fabricating a plurality of the bond pads in parallel between the first terminal and the second terminal, each of the bond pads including a first set of the one or more conductors and a second set of the one or more conductors, each of the first set of conductors and the second set of conductors configured to be electrically shorted when ball bonds are formed on the plurality of bond pads respectively.

16. The method of claim 15, wherein further comprising fabricating a plurality of trimming resistors coupled in series with the plurality of bond pads respectively.

17. The method of claim 16, wherein the plurality of trimming resistors are the same resistive value.

18. The method of claim 16, wherein the plurality of trimming resistors are of a different value.

* * * * *